(12) United States Patent
Gotkis et al.

(10) Patent No.: US 7,945,086 B2
(45) Date of Patent: May 17, 2011

(54) TUNGSTEN PLUG DEPOSITION QUALITY EVALUATION METHOD BY EBACE TECHNOLOGY

(75) Inventors: Yehiel Gotkis, Fremont, CA (US);
Sergey Lopatin, Morgan Hill, CA (US);
Mehran Nasser-Ghodsi, Hamilton, MA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 1153 days.

(21) Appl. No.: 11/622,793

(22) Filed: Jan. 12, 2007

(65) Prior Publication Data
US 2009/0010526 A1 Jan. 8, 2009

Related U.S. Application Data

(60) Provisional application No. 60/758,818, filed on Jan. 12, 2006.

(51) Int. Cl.
G06K 9/00 (2006.01)
H01L 21/3205 (2006.01)
(52) U.S. Cl. ........................................ 382/149; 438/586
(58) Field of Classification Search .................. 382/149
See application file for complete search history.

(56) References Cited

U.S. PATENT DOCUMENTS

| 4,315,782 A | 2/1982 | Tarng |
| 4,622,095 A | 11/1986 | Grobman et al. |
| 4,897,552 A | 1/1990 | Okunuki et al. |
| 4,966,885 A | 10/1990 | Hebard |
| 4,994,140 A * | 2/1991 | Kenzo et al. .................. 438/504 |
| 5,188,706 A | 2/1993 | Hori et al. ........................ 216/12 |
| 5,346,841 A | 9/1994 | Yajima |
| 5,686,171 A | 11/1997 | Vokoun et al. ................ 428/209 |
| 5,736,002 A | 4/1998 | Allen et al. |
| 6,027,842 A | 2/2000 | Ausschnitt et al. |
| 6,133,147 A * | 10/2000 | Rhee et al. ..................... 438/677 |
| 6,673,637 B2 * | 1/2004 | Wack et al. ...................... 438/14 |

(Continued)

FOREIGN PATENT DOCUMENTS
JP 40115539 A 4/1989

OTHER PUBLICATIONS
Office Action dated Dec. 7, 2009 for U.S. Appl. No. 11/622,625.
(Continued)

*Primary Examiner* — David P Rashid
(74) *Attorney, Agent, or Firm* — Joshua D. Isenberg; JDI Patent

(57) ABSTRACT

A first embodiment of the invention relates to a method for evaluating the quality of structures on an integrated circuit wafer. Test structures formed on either on the integrated or on a test wafer are exposed to an electron beam and an electron-beam activated chemical etch. The electron-beam activated etching gas or vapor etches the test structures, which are analyzed after etching to determine a measure of quality of the test structures. The measure of quality may be used in a statistical process control to adjust the parameters used to form device structures on the integrated circuit wafer. The test structures are formed on an integrated circuit wafer having two or more die. Each die has one or more integrated circuit structures. The test structures are formed on scribe lines between two or more adjacent die. Each test structure may correspond in dimensions and/or composition to one or more of the integrated circuit structures.

19 Claims, 3 Drawing Sheets

U.S. PATENT DOCUMENTS

| | | | |
|---|---|---|---|
| 6,753,538 B2 | 6/2004 | Musil et al. ............... 250/492.2 |
| 6,771,806 B1* | 8/2004 | Satya et al. .................. 382/149 |
| 6,787,783 B2* | 9/2004 | Marchman et al. ........ 250/492.2 |
| 6,843,927 B2 | 1/2005 | Naser-Ghodsi ................. 216/84 |
| 6,943,350 B2* | 9/2005 | Nasser-Ghodsi et al. ......... 850/1 |
| 7,148,073 B1 | 12/2006 | Soltz et al. |
| 7,312,448 B2 | 12/2007 | Principe |
| 7,348,556 B2 | 3/2008 | Chitturi et al. |
| 2002/0048913 A1 | 4/2002 | Finney |
| 2003/0047691 A1 | 3/2003 | Musil et al. |
| 2004/0013858 A1 | 1/2004 | Hacker et al. .............. 428/195.1 |
| 2004/0033425 A1 | 2/2004 | Koops et al. |
| 2004/0041095 A1 | 3/2004 | Nasser-Ghodsi et al. |
| 2004/0266200 A1 | 12/2004 | Schaller et al. ............... 438/705 |
| 2005/0048751 A1* | 3/2005 | Moore ......................... 438/586 |
| 2006/0000802 A1 | 1/2006 | Kumar et al. .................. 216/67 |
| 2007/0069759 A1* | 3/2007 | Rzepiela et al. ............... 324/765 |
| 2007/0158303 A1 | 7/2007 | Nasser-Ghodsi et al. ......... 430/5 |
| 2007/0158304 A1 | 7/2007 | Nasser-Ghodsi et al. ....... 216/66 |
| 2007/0158562 A1 | 7/2007 | Nasser-Ghodsi et al. ..... 250/310 |
| 2007/0264831 A1 | 11/2007 | Yu |
| 2008/0088831 A1 | 4/2008 | Mulders et al. |

OTHER PUBLICATIONS

Office Action dated Dec. 24, 2009 for U.S. Appl. No. 11/622,605.

Notice of Allowance and Fee(s) dated Dec. 17, 2009 for U.S. Appl. No. 11/622,758.

Asakawa et al. Chlorine Based Dry Etching og III/V Compound Semiconductors for Optoelectronics Application, Nov. 18, 1997, Japanese Journal of Applied Physics, vol. 37, pp. 373-387.

Kowalksi, Ion Bombardment modification of surface morphology of Solids, 1994, Journal of Materials Science, vol. 29, pp. 3542-3552.

Jain et al., Thermal Dry-Etching of Copper Using Hydrogen peroxide and Hexafluroacetylacetone, Thin Solid Films 269 (1995) pp. 51-56.

P5II, An Introduction to Plasma Source Ion Implantation, University of Wisconsin Center of Plasma Aided Manufacturing, Oct. 30, 2005.

Office Action dated Apr. 13, 2010 issued for U.S. Appl. No. 11/752,829.

Office Action dated Jun. 10, 2010 issued for U.S. Appl. No. 11/622,625.

Matsui et al., Electron Beam Induced Selective Etching and Deposition Technology, 1989, Journal of Vacuum Science and Technology, Sep. / Oct. 1989, B7, vol. 5, pp. 1182-1190.

Wang et al., Etching Characteristics to Chromium Thin Films by an Electron Beam Induced Surface Reaction, 2003, Semiconductor Science and Technology, vol. 18, pp. 199-205.

Final Office Action dated Jun. 4, 2010 issued for U.S. Appl. No. 11/622,605.

Notice of Allowance and Fees Due dated Sep. 17, 2010 issued for U.S. Appl. No. 11/622,605.

Office Action dated Sep. 13, 2010 issued for U.S. Appl. No. 11/752,829.

Office Action dated Dec. 3, 2010 issued for U.S. Appl. No. 11/622,625.

Toyoda et al., Ultra Smooth Surface Preparation using Gas Cluster Ion Beams, 2002, Japanese Journal of Applied Physics, vol. 41, pp. 4287-4290.

U.S. Appl. No. 60/758,818 entitled "Tungsten Plug Deposition Quality Evaluation Method by EBACE Tecnology" to Yehiel Gotkis, filed Jan. 12, 2006.

U.S. Appl. No. 60/829,636 entitled "Etch Selectivity Enhancement in Electron Beam Activated Chemical Etch" to Nasser-Ghodsi; Mehran; et al., filed Oct. 16, 2006.

U.S. Appl. No. 60/829,643 entitled "Structural Modification Using Electron Beam Activated Chemical Etch" to Nasser-Ghodsi; Mehran; et al., filed Oct. 16, 2006.

U.S. Appl. No. 60/829,659 entitled "Three-Dimensional Imagine Using Electron Beam Activated Chemical Etch" to Nasser-Ghodsi; Mehran; et al., filed Oct. 16, 2006.

U.S. Appl. No. 11/622,793 entitled "Tungsten Plug Deposition Quality Evaluation Method by EBACE Technology" to Yehiel Gotkis, filed Jan. 12, 2007.

International Search Report and Written Opinion for International Application No. PCT/US07/60503.

A. Jain et al., "Thin Solid Film" vol. 269, pp. 51-56, 1995, Jan. 29, 2008.

Final Office Action Feb. 24, 2011 issued for U.S. Appl. No. 11/752,829, 14 pages.

\* cited by examiner

TUNGSTEN PLUG DEPOSITION QUALITY EVALUATION METHOD BY EBACE TECHNOLOGY

CLAIM OF PRIORITY

This application claims the benefit of priority of co-pending U.S. provisional application No. 60/758,818 entitled to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

GOVERNMENT INTERESTS

This invention was made with Government support during an effort supported by a Government "Other Transaction", award number W911NF-04-3-0001, awarded by the U.S. Army Research Laboratory (ARL). The Government has certain rights in the invention.

FIELD OF THE INVENTION

This invention generally relates to semiconductor fabrication and more particularly to evaluation of the quality of structures on an integrated circuit wafer.

BACKGROUND OF THE INVENTION

Tungsten plugs transfer current between upper and lower interconnect levels in a semiconductor integrated circuit. Holes are formed in an insulating layer by dry etching. The tungsten is deposited in the holes by a chemical vapor deposition (CVD) process. Being formed via a surface driven chemical process, the tungsten grows from the bottom and walls of the holes. Growth of the tungsten stops when the holes are closed. The holes usually do not close perfectly because of growing layer surface roughness. Because the holes are not perfectly filled, there is usually a seam in the center of the tungsten plug. After tungsten deposition, an etch or chemical mechanical polishing (CMP) step removes the overburden. Both dry etch and CMP involve significant degree of chemical reaction with the tungsten overburden. This reaction is active on all kinds of interfaces. Usually the seam becomes the most chemically vulnerable plug location, which is etched out during CMP or dry etch. Often one finds a keyhole in the center of the plug as a result of the chemical etching. The holes affect the plug electrical properties and electromigration performance and also trap chemicals inducing corrosion effects. Therefore it is important to evaluate the deposition quality of the tungsten plugs.

The deposition processes parameters may be adjusted to optimize the quality of the plugs. However, to do so it is necessary to determine how many plugs have unacceptably large voids. This typically requires etching away the tungsten until the voids in the plugs become visible. A technique is known as electron beam activated chemical etch (EBACE). In this technique an etchant is introduced through a needle into the field of view of a scanning electron microscope proximate the surface of an integrated circuit device. The etchant is usually one that is known to respond to electron-beam induced activation. Thus, localized etching of the surface can be combined with real time imaging of the surface as it is etched. Unfortunately, this technique typically involves sacrificing some of the devices on a particular wafer, which reduces yield and increases costs.

Thus, there is a need in the art for a method of determining the quality of tungsten deposition that overcomes the above disadvantages.

SUMMARY OF THE INVENTION

A first embodiment of the invention relates to a method for evaluating the quality of structures on an integrated circuit wafer. Test structures formed either on the integrated or on a test wafer are exposed to an electron beam and an electron-beam activated chemical etching gas or vapor. The electron-beam activated etching gas or vapor etches the test structures, which are analyzed after etching to determine a measure of quality of the test structures. The measure of quality may be used in a statistical process control to adjust the parameters used to form device structures on the integrated circuit wafer.

In a particular embodiment of the invention the test structures are formed on an integrated circuit wafer having two or more die. Each die has one or more integrated circuit structures. The test structures are formed on scribe lines between two or more adjacent die. Each test structure may correspond in dimensions and/or composition to one or more of the integrated circuit structures.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
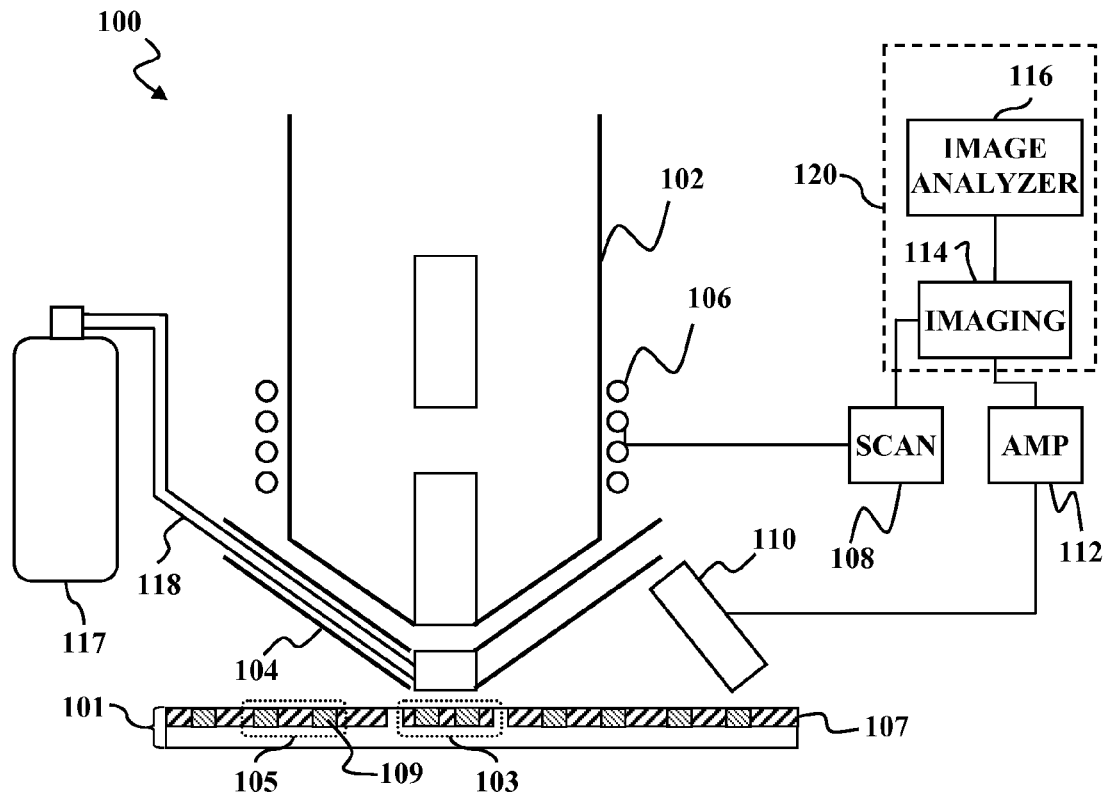
FIG. 1A is a schematic diagram of an electron beam activated chemical etch (EBACE) system adapted for evaluating integrated circuit structures according to an embodiment of the present invention.
Figure 1B:
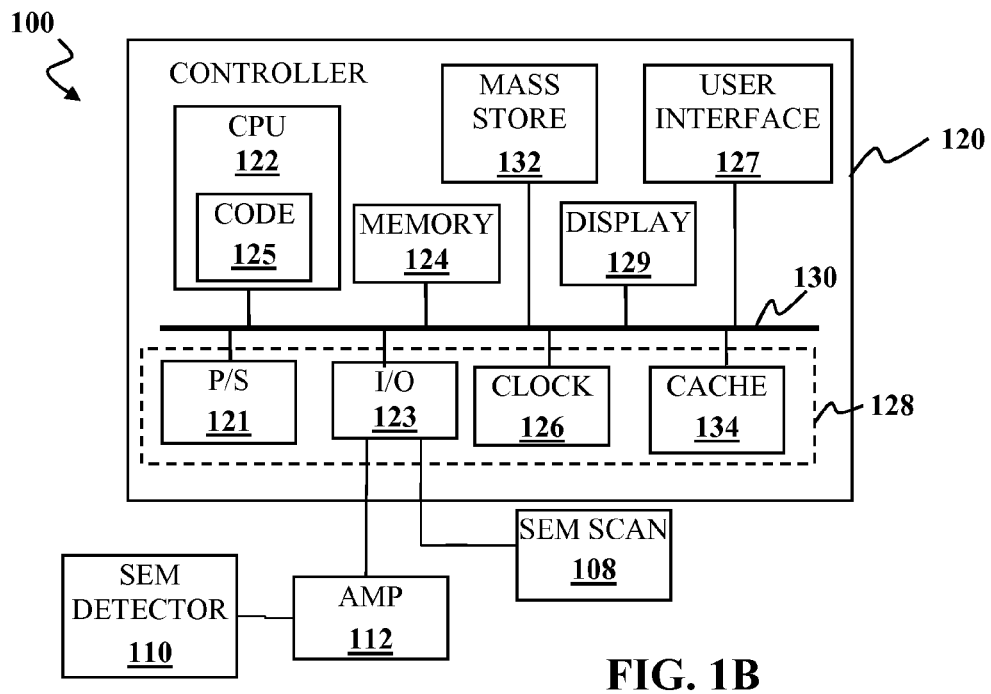
FIG. 1B is a block diagram of the system of FIG. 1A.

FIGS. 1A-1B illustrate an example of an electron beam activated chemical etch (EBACE) system 100 adapted for use with embodiments of the present invention. As shown in FIG. 1A, the system 100 generally includes a scanning electron microscope having an electron beam column 102 with an immersion lens 104. Electrons from the electron beam column are focused onto a target surface 101, which may be an integrated circuit wafer or a test wafer. The electrons are scanned across the surface of the target 101 by magnet deflecting fields provided by one or more scanning coils 106. Current is provided to the coils 106 via a scanner driver 108. Electrons striking the target 101 are either backscattered or initiate secondary emission. Either way a detector 110 generates a signal proportional to the amount of backscattering or secondary emission. The signal may be amplified by an amplifier 112. The amplified signal and a signal from the scanner driver are combined by an image generator 114 to produce a high-contrast, magnified image of the surface of the target 101. The images are analyzed by an image analyzer 116.

The target 101 includes one or more test structures 103. The test structures typically correspond in dimensions (e.g., diameter and depth) to one or more integrated circuit structures 105 that may be located on the target 101 or on another wafer. By way of example, and without loss of generality, the integrated circuit structures 105 may be conductive interconnects between adjacent layers of an integrated circuit device. Such interconnects may be formed by etching holes through a layer of insulating material 107 and filling the holes with a conductive or semiconductive material 109, e.g., tungsten or silicon.

An electron activated etching gas or vapor is introduced from a remote source 117 via a conduit 118. It is desirable to introduce the etching gas or vapor as close as possible to the point on the surface of the target 101 impacted by the electrons from the electron beam column 102. By way of example, the etching gas or vapor may be introduced between two adjacent electrodes of the immersion lens 104. The electrons activate localized etching of the target surface 101. Images of the etched surface generated by the image analyzer may be analyzed by the image analyzer 116. The image analysis determines a measure of quality of the test structures 103, e.g., the number and size of voids resulting from the formation of interconnect structures.

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of program code 125. The code 125 may control the scanning of the electron beam by the coils 104 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, and the detector 110 or amplifier 112 through the I/O functions 123 in response to data and program code instructions stored and retrieved by the memory 124. Depending on the configuration or selection of controller 120 the scanner driver 108 and detector 108 or amplifier 112 may interface with the I/O functions via conditioning circuits. The conditioning circuits may be implemented in hardware or software form, e.g., within code 125.

Figure 2:
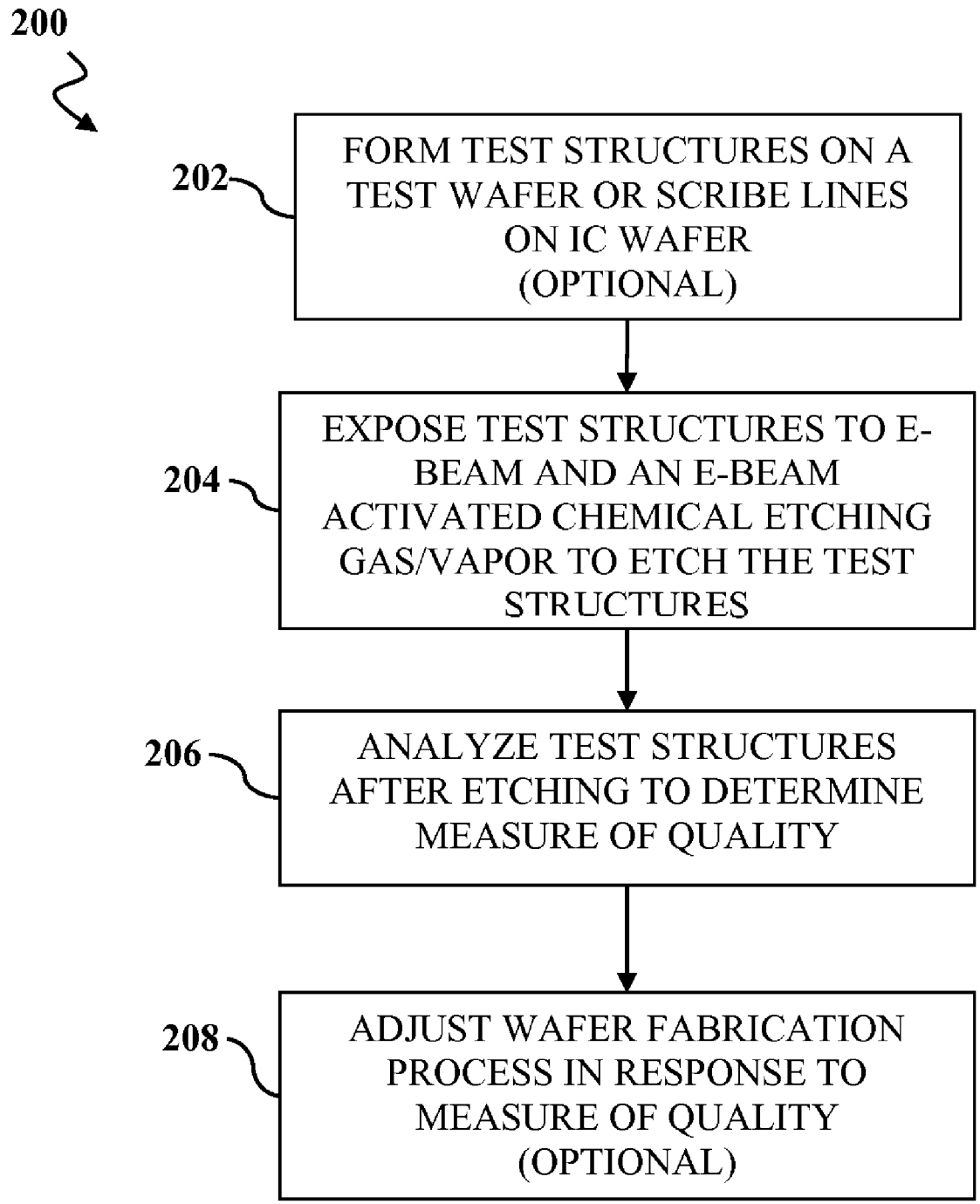
FIG. 2 is a flow diagram illustrating an example of a method for evaluating integrated circuit structures according to an embodiment of the invention.

FIG. 2 illustrates a method for evaluating the quality of structures on an integrated circuit wafer. At 202 test structures may optionally be formed on a test wafer or on an integrated circuit (IC) wafer. The test structures may be formed on a test wafer or on the integrated circuit wafer at locations on one or more scribe lines between two or more die on the integrated circuit wafer. At 204, the test structures are exposed to an electron beam and an etching gas (or vapor), such as xenon di-fluoride ($XeF_2$). The etching gas or vapor concentration and electron beam density in the vicinity of the test structures are sufficient for the electron-beam activated etching of the test structures.

After etching the test structures are analyzed at 206 to determine a measure of quality of the test structures. The test structures may be analyzed by using a scanning electron microscope to produce one or more images of the test structures. The scanning electron microscope (SEM) may provide the electron beam that interacts with the etching gas or vapor and the sample activating their chemical interaction. If the test structures are located on the integrated circuit wager, e.g., on scribe lines between die, the use of the highly focused beam of a scanning electron microscope limits exposure of the die to the electron beam and/or etching gas or vapor. As a result, the etching gas or vapor molecules etch the test structures but not the die.

The images generated by the SEM may be analyzed, e.g., by performing pattern recognition on the images, to determine the measure of quality. The pattern recognition may include determining a size of a void in each test structure. By way of example, the measure of quality may be a number of voids in the test structures that are greater than a predetermined minimum size. A histogram of the sizes of the voids may be created from the pattern recognition information. The histogram may be used in statistical process control of the integrated circuit fabrication process. Alternatively, the measure of quality may be an average grey level of one or more of the images. The average grey level may be empirically related to a number of test structures with unacceptably large voids. A yield loss may be determined at a location on the integrated circuit wafer from the measure of quality.

The wafer fabrication process used to form the integrated circuit structures may be adjusted at 208 based on the measure of quality and/or statistical process control.

Figure 3A:
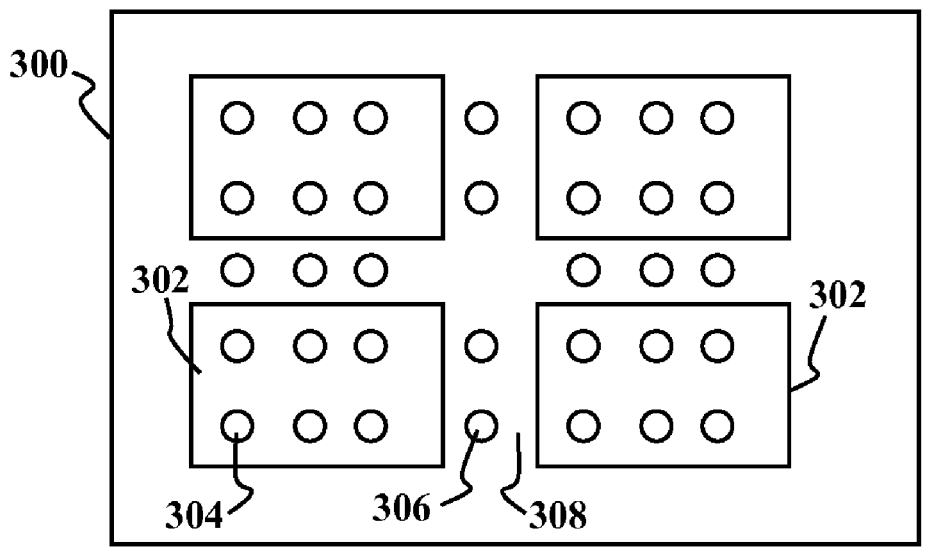
FIG. 3A is a plan view schematic diagram illustrating a portion of an integrated circuit wafer including an apparatus for evaluating integrated circuit structures.

In embodiments of the present in invention, test structures may be formed directly on a production integrated circuit wafer. Such embodiments of the invention allow in-line quality control that can facilitate a quick response to manufacturing problems and implementation of troubleshooting without using special test wafers or losing product wafers for control and troubleshooting needs. The test structures are located such that the localized etching of the test structures with EBACE does not affect integrated circuit structures on nearby dies. FIG. 3A shows an example of a first embodiment of an apparatus for evaluating the quality of the integrated circuit structures. An integrated circuit wafer 300 includes a plurality of die 302. Each die includes one or more integrated circuit structures 304. The wafer 300 includes one or more test structures 306 formed at scribe lines 308 between two or more adjacent die 302. Preferably, each test structure 306 corresponds in dimensions and composition to one or more of the integrated circuit structures 304. For example, the integrated circuit structures 304 may be electrical interconnects in the form of conductive or semiconductive plugs formed in holes of a particular diameter through an insulator layer between adjacent device layers. The test structures 306 may be similarly configured and fabricated by the same process used to form the integrated circuit structures. In this way, the test structures 306 may be examined for voids or other production-related defects without unnecessarily sacrificing integrated circuit structures. In addition, information about the location of and number of defective test structures 306 may be used to determine where on the wafer 300 yield loss is a problem. The process can then be adjusted for subsequent wafers based on this information. Pattern recognition analysis of the test structures 306 is particularly suitable in situations involving high cost or limited volume advanced development products.

Figure 3B:
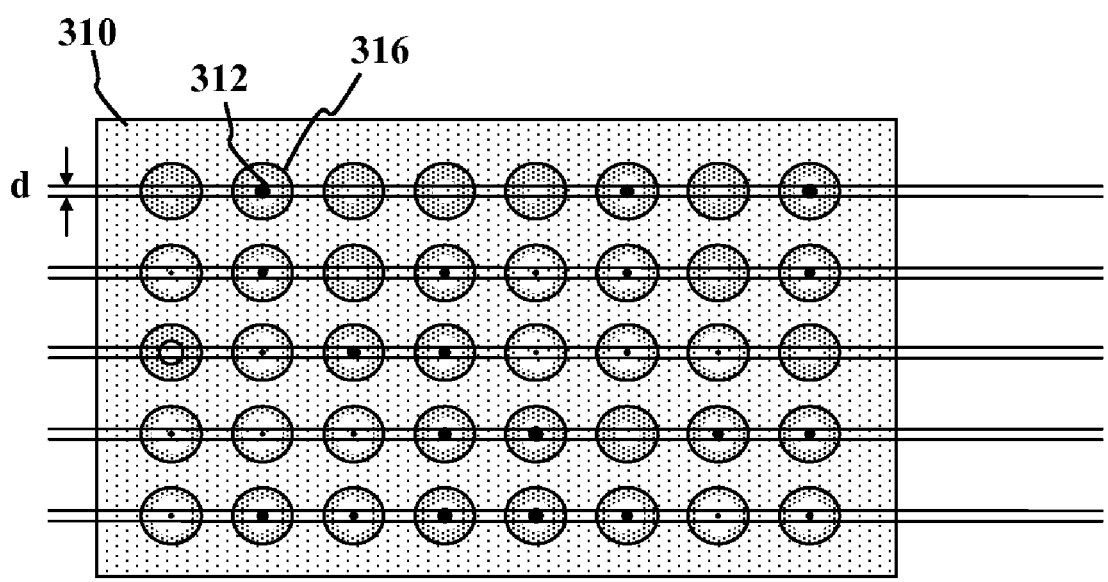
FIG. 3B is a plan view schematic diagram of a test wafer illustrating evaluation of integrated circuit structures according to an embodiment of the invention.

FIG. 3B shows an alternative example of a test wafer for evaluating the quality of integrated circuit structures. Pattern recognition analysis of test structures 316 etched using EBACE in conjunction with SEM may be too slow for some applications. Consequently, in alternative embodiments of the invention, test structures 316 may be formed on a separate test wafer 310. The test wafer 310 preferably uses the same starting substrate material as a production wafer. The test structures 316 are formed using the same type of process as is used to form corresponding integrated circuit features on the production wafer. In this example, the test structures 316 are electrical interconnects having a conductive material disposed in a hole. Performing EBACE or other etching on the test structures exposes voids 312 in some of them. It is generally preferably that the voids be no larger than some maximum diameter d. SEM may be used in conjunction with pattern recognition to determine the presence and/or size of the voids 312 in the test structures 316. Note that it is not necessary to test all of the test structures. One can determine a number of structures to test based on process criteria and process statistics.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for evaluating the quality of structures on an integrated circuit wafer, comprising the steps of:
    exposing one or more test structures to an electron beam and an electron-beam activated chemical etching gas or vapor, wherein the one or more test structures are formed in a test wafer or on the integrated circuit wafer at one or more scribe lines between two or more die on the integrated circuit wafer, whereby the electron-beam activated chemical etching gas or vapor etches the one or more test structures; and
    analyzing the one or more test structures after etching to determine a measure of quality of the one or more test structures,
    wherein exposing the one or more test structures to the electron beam includes the use of a scanning electron microscope to provide the electron beam and to produce one or more images of the one or more test structures,
    wherein analyzing the one or more test structures further comprises performing a pattern recognition on the one or more images,
    wherein performing the pattern recognition includes determining a size of a void in each test structure and creating a histogram of the sizes of the voids.

2. The method of claim 1 wherein each test structure includes a hole filled with a conductive or semiconductive material therein.

3. The method of claim 2 wherein the conductive or semiconductive material is tungsten or silicon.

4. The method of claim 1, further comprising the step of determining a yield loss at a location on the integrated circuit wafer from the measure of quality.

5. The method of claim 1 wherein the one or more test structures correspond in dimensions and composition to one or more structures on the integrated circuit wafer.

6. The method of claim 1 wherein the measure of quality is a number of voids in the one or more test structures that are greater than a predetermined minimum size.

7. The method of claim 1 wherein performing the pattern recognition includes determining a size of a void in each test structure.

8. The method of claim 1 wherein the measure of quality is an average grey scale of one or more of the images.

9. A method for evaluating the quality of structures on an integrated circuit wafer, comprising the steps of:
    simultaneously exposing one or more test structures to an electron beam and an electron-beam activated chemical etching gas or vapor, wherein the one or more test structures are formed in a test wafer or on the integrated circuit wafer at one or more scribe lines between two or more die on the integrated circuit wafer, whereby the electron-beam activated chemical etching gas or vapor etches the one or more test structures; and
    analyzing the one or more test structures after etching to determine a measure of quality of the one or more test structures,
    wherein the one or more test structures are on the integrated circuit wafer at locations on one or more scribe lines between two or more die on the integrated circuit wafer,
    wherein exposing one or more test structures to an electron beam and an electron-beam activated chemical etching gas or vapor includes limiting exposure of the die to the electron beam or electron beam activated chemical etching gas or vapor, whereby the electron beam activated chemical etching gas or vapor etches the one or more test structures but not the die.

10. The method of claim 9 wherein the electron beam activated chemical etching gas or vapor is xenon di-fluoride ($XeF_2$).

11. The method of claim 8 wherein the measure of quality is a number of voids in the one or more test structures that are greater than a predetermined minimum size.

12. The method of claim 8 wherein performing the pattern recognition includes determining a size of a void in each test structure.

13. The method of claim 8 wherein the measure of quality is an average grey scale of one or more of the images.

14. The method of claim 8 wherein each test structure includes a hole filled with a conductive or semiconductive material therein.

15. The method of claim 8, further comprising the determining a yield loss at a location on the integrated circuit wafer from the measure of quality.

16. The method of claim 9 wherein the one or more test structures correspond in dimensions and composition to one or more structures on the integrated circuit wafer.

17. An apparatus for evaluating the quality of structures on an integrated circuit wafer, comprising:
- means for exposing one or more test structures to an electron beam and an electron-beam activated chemical etching gas or vapor, wherein the one or more test structures are formed in a test wafer or on the integrated circuit wafer at one or more scribe lines between two or more die on the integrated circuit wafer, whereby the electron-beam activated chemical etching gas or vapor etches the one or more test structures; and
- means for analyzing the one or more test structures after etching to determine a measure of quality of the one or more test structures,
- wherein exposing the one or more test structures to the electron beam includes the use of a scanning electron microscope to provide the electron beam and to produce one or more images of the one or more test structures,
- wherein analyzing the one or more test structures further comprises performing a pattern recognition on the one or more images,
- wherein performing the pattern recognition includes determining a size of a void in each test structure and creating a histogram of the sizes of the voids.

18. The apparatus of claim 17 further comprising means for determining a yield loss at a location on the integrated circuit wafer from the measure of quality.

19. An apparatus for evaluating the quality of structures on an integrated circuit wafer, comprising:
- means for simultaneously exposing one or more test structures to an electron beam and an electron-beam activated chemical etching gas or vapor, wherein the one or more test structures are formed in a test wafer or on the integrated circuit wafer at one or more scribe lines between two or more die on the integrated circuit wafer, whereby the electron-beam activated chemical etching gas or vapor etches the one or more test structures; and
- means for analyzing the one or more test structures after etching to determine a measure of quality of the one or more test structures,
- wherein the one or more test structures are on the integrated circuit wafer at locations on one or more scribe lines between two or more die on the integrated circuit wafer,
- wherein exposing one or more test structures to an electron beam and an electron-beam activated chemical etching gas or vapor includes limiting exposure of the die to the electron beam or electron beam activated chemical etching gas or vapor, whereby the electron beam activated chemical etching gas or vapor etches the one or more test structures but not the die.

\* \* \* \* \*